United States Patent [19]
Schwent

[11] Patent Number: 6,002,922
[45] Date of Patent: *Dec. 14, 1999

[54] METHOD AND APPARATUS FOR DETECTING COMMUNICATION SIGNALS

[75] Inventor: Dale Gerard Schwent, Schaumburg, Ill.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/767,744

[22] Filed: Dec. 17, 1996

[51] Int. Cl.⁶ .............................. H03C 1/62; H04B 17/00
[52] U.S. Cl. ........................................... 455/115; 455/126
[58] Field of Search .................................... 455/115, 126, 455/127, 67.1, 226.1, 226.2, 116; 330/134, 279, 277, 296; 333/109

[56] References Cited

U.S. PATENT DOCUMENTS

| | | | |
|---|---|---|---|
| 5,126,686 | 6/1992 | Tam | 455/126 |
| 5,363,071 | 11/1994 | Schwent et al. | |
| 5,404,585 | 4/1995 | Vimpari et al. | 455/127 |
| 5,438,683 | 8/1995 | Durtler et al. | 455/126 |
| 5,448,771 | 9/1995 | Klomsdorf et al. | 455/127 |
| 5,673,001 | 9/1997 | Kim et al. | 455/126 |

FOREIGN PATENT DOCUMENTS

397311A2  11/1990  European Pat. Off. .

*Primary Examiner*—Nguyen Vo
*Attorney, Agent, or Firm*—John J. King

[57] ABSTRACT

A unique method and apparatus for detecting the power level of communication signals, such as RF communication signals being transmitted from a wireless communication device (100), increases the dynamic range of a conventional power detector. The method and apparatus selectively switches between two power detection paths (314, 317) with different operating ranges. More particularly, when a transmitted signal having a power within a predetermined range is detected, a first path is biased to transmit the RF communication signal. The predetermined range could be determined, for example, by a number of power steps. Similarly, when a transmitted signal having a power in a second predetermined range is detected, such as a low power transmitted signal, a second path provided. Preferably, the second path includes an amplifier (372) to offset the loss of resolution as the detect voltage is low.

14 Claims, 4 Drawing Sheets

METHOD AND APPARATUS FOR DETECTING COMMUNICATION SIGNALS

FIELD OF THE INVENTION

The present invention relates generally to communication devices, and more particularly to a method and apparatus for detecting communication signals.

BACKGROUND OF THE INVENTION

Devices for transmitting communication signals, such as radio frequency (RF) communication signals, must regulate the power at which the signals are transmitted. For example, a conventional cellular telephone, such as a class III portable as defined under the IS-19 standard published by the Electronics Industry Association/Telecommunications Industry Association (EIA/TIA) located at 2001 Pennsylvania Ave., N.W. Washington, D.C. 20006, is adapted to transmit RF signals at one of six predetermined power levels varying at 4 dB steps. The more recent IS-136 standard, also published by the EIA/TIA, calls for a class IV portable which is required to have three additional power steps below the step 7 level of class III portables. Each of these new levels is also a 4 dB step, requiring a power control dynamic range increase from 20 to 32 dB.

Conventional radio designs use a coupler with a peak detector on the coupled port to detect radio power output for power setting purposes. The peak detector operates with a minimal bias voltage. At higher power out levels, the detector output voltage linearly tracks the power into the peak detector. As power falls, the detect output voltage approaches its bias value asymptotically.

As a result, the power/detector output voltage curve no longer follows the linear slope. Also, larger changes in power are required to produce each dB of change in detector output voltage, resulting in a loss of resolution as the detector output voltage approaches its bias value.

Conventional radio designs also typically set the coupling ratio to provide the minimum necessary power into the detector at the lowest power step in order to keep the detector insertion loss to a minimum. Applying this technique to a class IV portable would require a 12 dB increase in coupling ratio to maintain equal performance. With existing couplers operating in the 16 to 20 dB range for coupling, such an approach would require a detector with a 4 to 8dB coupling ratio. Such a coupler would have an unacceptably high insertion loss.

Accordingly, there is a need for a method and apparatus for detecting communication signals over a wider dynamic range.

DETAILED DESCRIPTION OF A PREFERRED EMBODIMENT

According to the present disclosure, a unique method and apparatus for detecting communication signals, such as RF communication signals being transmitted from a wireless communication device, increases the dynamic range of a conventional power detector. As set forth in more detail below, the method and apparatus selectively switches between two power detection paths with different operating ranges. More particularly, when a transmitted signal having a power within a predetermined range is detected, a first diode associated with a first path is biased to detect the RF communication signal. The predetermined range could be determined, for example, by a number of power steps. Similarly, when a transmitted signal having a power in a second predetermined range (such as a lower set of power steps) is detected, a second path is provided. Preferably, the second path includes an amplifier to offset the loss of resolution, as the detector output voltage is low.

Figure 1:
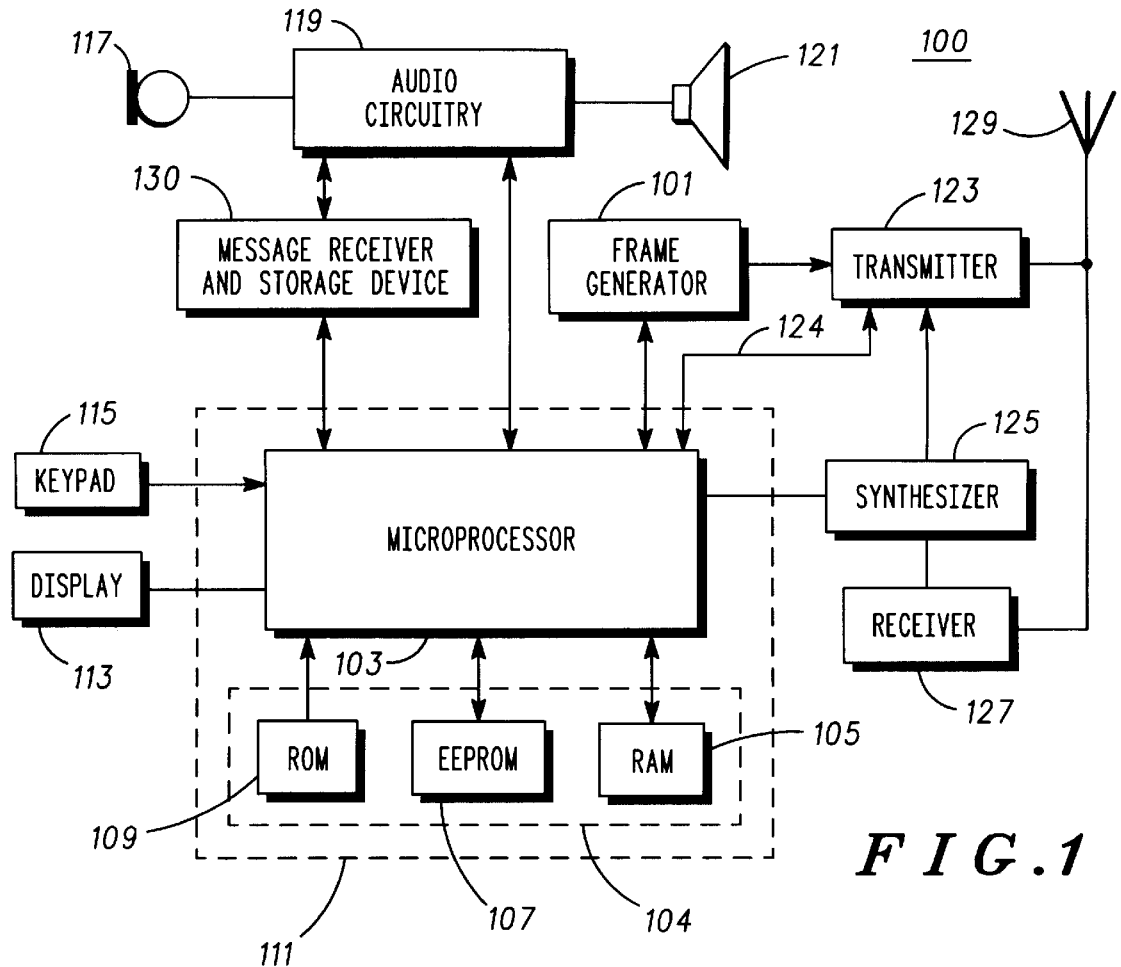
FIG. 1 is a block diagram of a wireless communication device according to the present invention.

Turning first to FIG. 1, a block diagram of a wireless communication device such as a cellular radiotelephone incorporating the present invention is shown. In the preferred embodiment, a frame generator ASIC 101, such as a CMOS ASIC available from Motorola, Inc. and a microprocessor 103, such as a 68HC11 microprocessor also available from Motorola, Inc., combine to generate the necessary communication protocol for operating in a cellular system. Microprocessor 103 uses memory 104 comprising RAM 105, EEPROM 107, and ROM 109, preferably consolidated in one package 111, to execute the steps necessary to generate the protocol and to perform other functions for the communication unit, such as writing to a display 113, accepting information from a keypad 115, controlling a frequency synthesizer 125, or performing steps and controlling components of the transmitter necessary to detect a communication signal according to the method of the present invention. ASIC 101 processes audio transformed by audio circuitry 119 from a microphone 117 and to a speaker 121.

A transceiver processes the radio frequency signals. In particular, a transmitter 123, adapted to communicate with microprocessor 103 by way of a bus 124, transmits through an antenna 129 using carrier frequencies produced by a frequency synthesizer 125. Information received by the communication device's antenna 129 enters receiver 127 which demodulates the symbols comprising the message frame using the carrier frequencies from frequency synthesizer 125. The communication device may optionally include a message receiver and storage device 130 including digital signal processing means. The message receiver and storage device could be, for example, a digital answering machine or a paging receiver.

Figure 2:
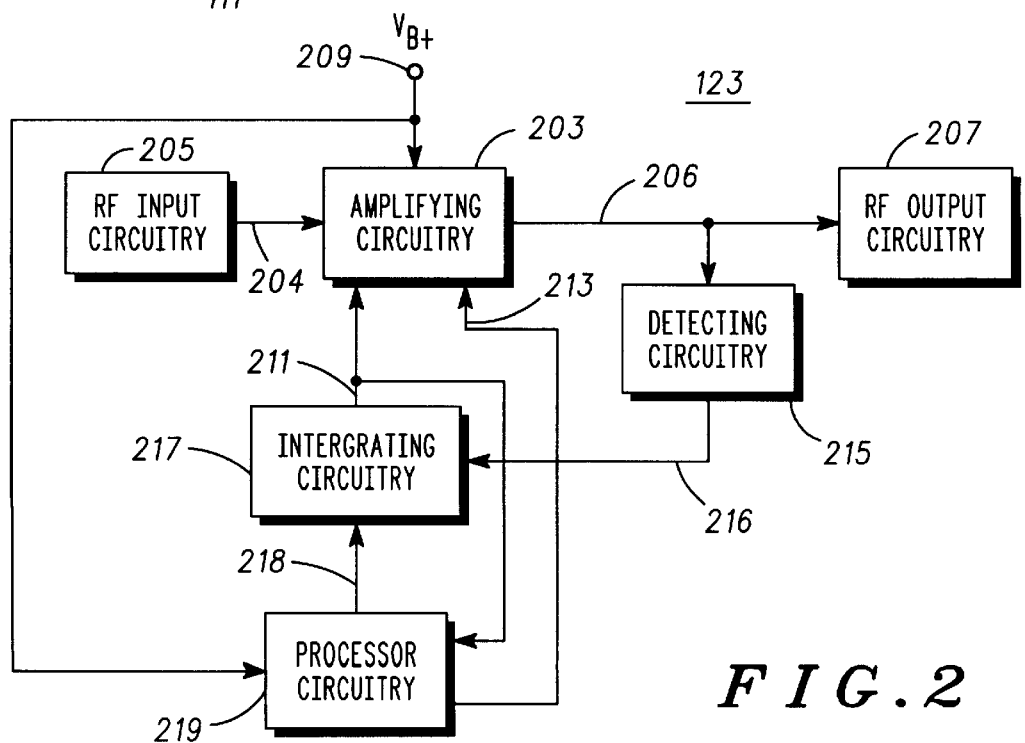
FIG. 2 is a block diagram of a transmitter circuit 123 of the wireless communication device of FIG. 1 according to the present invention.

Turning now to FIG. 2, a block diagram illustrates the transmitter 123 having amplifying circuitry 203 and corresponding control circuitry comprising detecting circuitry 215, integrating circuitry 217, and processor circuitry 219.

Amplifying circuitry 203 contains at least one amplifying element, preferably a gallium arsenide FET (Field Effect Transistor) to receive an input signal and generate an output signal which is an amplified version of the input signal. A power source 209, such as a battery, generates a battery voltage signal denoted by $V_{B+}$ and supplies power to the amplifying circuitry 203. Although the battery comprising the power source 209 may be fabricated to provide a particular battery voltage signal, such as 3.0 volts, 4.8 volts or 6.0 volts, when nominally charged, the amplifying circuitry 203 must be capable of functioning when the battery has significantly discharged to a voltage lower than the particular voltage.

Amplifying circuitry 203 amplifies an RF input signal 204 (typically containing voice and data to be transmitted)

provided by RF input circuitry 205 into an amplified RF output signal 206. The RF input signal 204 is amplified such that the amount of power in the RF output signal 206 corresponds to one of a plurality of predetermined power output levels which define the operation of the transmitter 123. The amplifying circuitry 203 subsequently outputs the RF output signal 206 to RF output circuitry 207.

The block diagram of FIG. 2 contains an output power control loop to maintain the output power of the amplifying circuitry 203. The power control loop is generally controlled by processor circuitry 219. Although transmitter 123 utilizes the integral processor circuitry 219, the processor-dependent functionality of the transmitter 123 could be solely provided by a central processor for the device, such as microprocessor 103 shown in FIG. 1.

The output power control loop maintains the amount of power in the RF output signal 206 at a constant level by varying the magnitude of amplification of the amplifying circuitry 203 via an amplifier control signal 211. The output power control loop consists of detecting circuitry 215, processor circuitry 219, and integrating circuitry 217 and functions while transmitter 123 is in operation.

Detecting circuitry 215 is coupled between the amplifying circuitry 203 and RF output circuitry 207 as well as to the integrating circuitry 217 to detect the power level of the RF output signal 206. Upon detection, the detecting circuitry 215 generates and outputs a detected power output signal 216 to the integrating circuitry 217. The detected power output signal 216 corresponds to the amount of power in the RF output signal 206. Detecting circuitry 215 will be described in more detail in reference to FIG. 3.

Processor circuitry 219 is coupled to the integrating circuitry 217 to provide a power output control signal 218. The power output control signal 218 contains a predetermined value defining the amount of power that should be in the RF output signal 206. The predetermined value is one of a plurality of phasing values stored in a memory of the processor circuitry 219 during manufacture.

Integrating circuitry 217 compares the detected power output signal 216 and power output control signal 218 to ensure that the amount of power in RF output signal 206 is correct. Integrating circuitry 217 accordingly adjusts the magnitude of amplifier control signal 211 to ensure that amplifying circuitry 203 provides an accurate and constant RF output signal 206.

Figure 3:
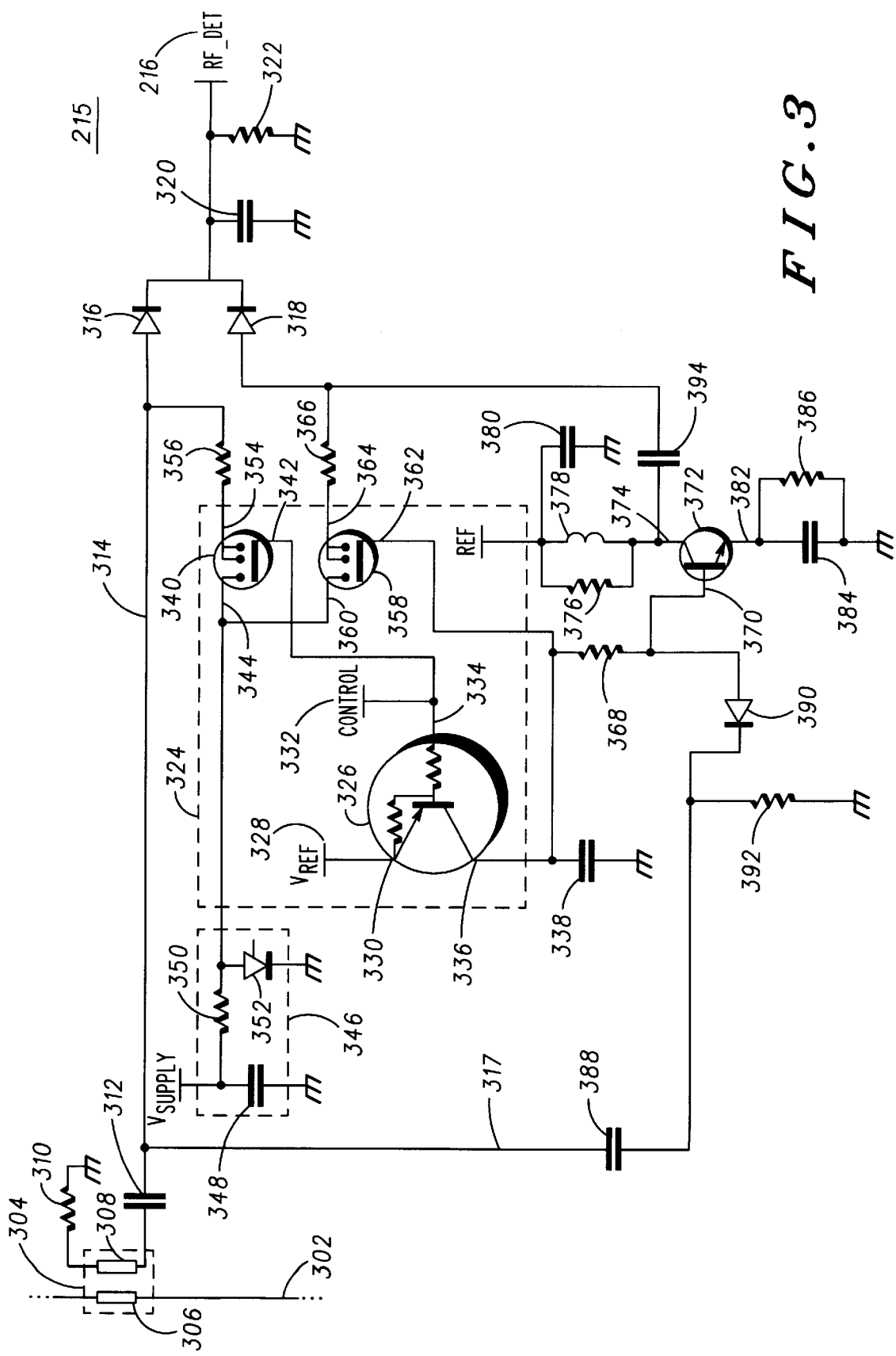
FIG. 3 is a schematic diagram of a detecting circuit 215 of FIG. 2 according to the present invention.

Turning now to FIG. 3, detecting circuitry 215 according to the present invention is shown in more detail. Detecting circuit 215 is coupled to a RF line 302 which couples RF signals by a coupler 304. RF line 302 provides an RF signal from amplifying circuitry 203 to RF output circuitry 207 as shown in FIG. 2. Coupler 304 preferably comprises a first coupling element 306 and a second coupling element 308. Coupling element 308 is preferably coupled in series between a resistor 310, which is coupled to ground, and a capacitor 312. Coupling element 308 provides a detected RF output signal to one of two paths to generate a power output signal 216 (RF DET). In particular, a first RF path 314 is coupled to a first diode 316 to generate a RF DET signal. Similarly, a second path 317, which will be described in more detail below, is coupled to a second diode 318. The RF DET signal is generated by one of diodes 316 or 318 by way of detector load elements, including a capacitor 320 and a resistor 322 coupled in parallel as shown, which form a peak detector. However, additional load elements could be employed within the spirit and scope of the present invention.

Detecting circuitry 215 further includes a control circuit 324 which determines on which path of the two RF paths the detected RF signal will be transmitted. In particular, a control transistor 326 receives a reference voltage $V_{REF}$ 328 at an emitter 330 and receives a CONTROL signal 332 at a base 334. Depending upon the CONTROL signal, the voltage generated at collector 336, which is coupled to ground by a capacitor 338, will determine whether diode 316 or diode 318 is biased. At high levels of output power on line 302, the CONTROL signal is high, cutting off the control transistor 326 and applying bias to diode 316. At low power levels the CONTROL signal is low, cutting off bias to diode 316, and activating bias to diode 318. Diodes 316 and 318 are preferably matched and loaded identically such that they respond to RF power at their inputs in the same way. With no DC path for current in the "off" diode, each diode provides only a few tenths picofarad capacitance which is not enough to affect either operating mode.

The biasing of diodes 316 and 318 is preferably controlled by switches, such as transistors. In particular, CONTROL signal 332 is coupled to a transitor 340 at a base 342. A source 344 is coupled to a bias circuit 346 comprising a capacitor 348 coupled to receive a supply voltage $V_{SUPPLY}$. A resistor 350 of bias circuit 346 is also coupled between the supply voltage and a diode 352 coupled to ground. Bias circuit 346 controls the voltage to the drain of transistor 340. The CONTROL signal coupled to the gate of transistor 340 controls the transistor to generate a bias voltage for diode 316 by way of a current through a source 354 and a resistor 356. Bias circuit 346 is also coupled to a second bias transistor 358 and controls the voltage to the source 364 of transistor 358. A gate 362 is coupled to the collector 336 of transistor 326. Accordingly, the CONTROL signal, which controls transistor 326, indirectly controls the gate voltage of transistor 358 and the bias to diode 318 by way of the source 364 and resistor 366.

It should be noted that FET switches are preferably used for transistors 340 and 358 to switch the bias between diodes 316 and 318 because of the low operating voltages at this point in the circuit (0.4V). A bipolar switch in saturation would be a significant fraction of the bias voltage set up by diode 352, while a FET switch "on" resistance is not significant compared to resistors 356 and 366, which could be for example, 4.7 kΩ or some other high resistance value. However, other switches, transistors or devices could be used.

In addition to controlling transistor 340 and 358 which bias diodes 316 and 318, transistor 326 further controls the second RF path 317 by way of a resistor 368 coupled to a base 370 of a transistor 372 and pin diode 390. A low CONTROL signal provides bias to transistor 372 and to pin diode 390, which is preferably an RF device acting as a gain stage for the detected power from the coupler. Power from transistor 372 is delivered to the load resistor 376, which is detected by diode 318 and the detector load elements including capacitor 320 and resistor 322. The dynamic range increase of the detecting circuitry is enabled by the voltage gain of transistor 372, which is switched at a predetermined point in the operating range by microprocessor 103.

A collector 374 of transistor 372 is coupled to a bias circuit comprising a resistor 376 and an inductor 378 coupled in parallel between the reference voltage and collector 374. Inductor 378 resonates with the capacitance of diode 318 and the transistor's output capacitance to deliver the maximum voltage across resistor 376, providing the maximum increase in dynamic range. The emitter 382 is coupled to ground by way of a capacitor 384 and a resistor 386 coupled in parallel. The second RF path further comprises a blocking capacitor 388 coupled to a diode 390 and a resistor 392 coupled to ground. Because high levels of RF voltage at maximum power would turn on transistor 372 and could exceed the emitter-base breakdown of transistor 372, switching bias current away from transistor 372 is not sufficient to guarantee operation of the high power path. Therefore, diode 390, preferably a PIN diode, is located in path 317 to isolate and protect transistor 372 under high power conditions with its own high impedance and reverse breakdown. Diode 390 also serves to eliminate any loading effect of the transistor 372 base-emitter junction on the high power detect diode 316. In the low power mode, the bias current through resistor 368 acts to turn transistor 372 and diode 390 on. Finally, a capacitor 394 is coupled between collector 374 and diode 318.

Figure 4:
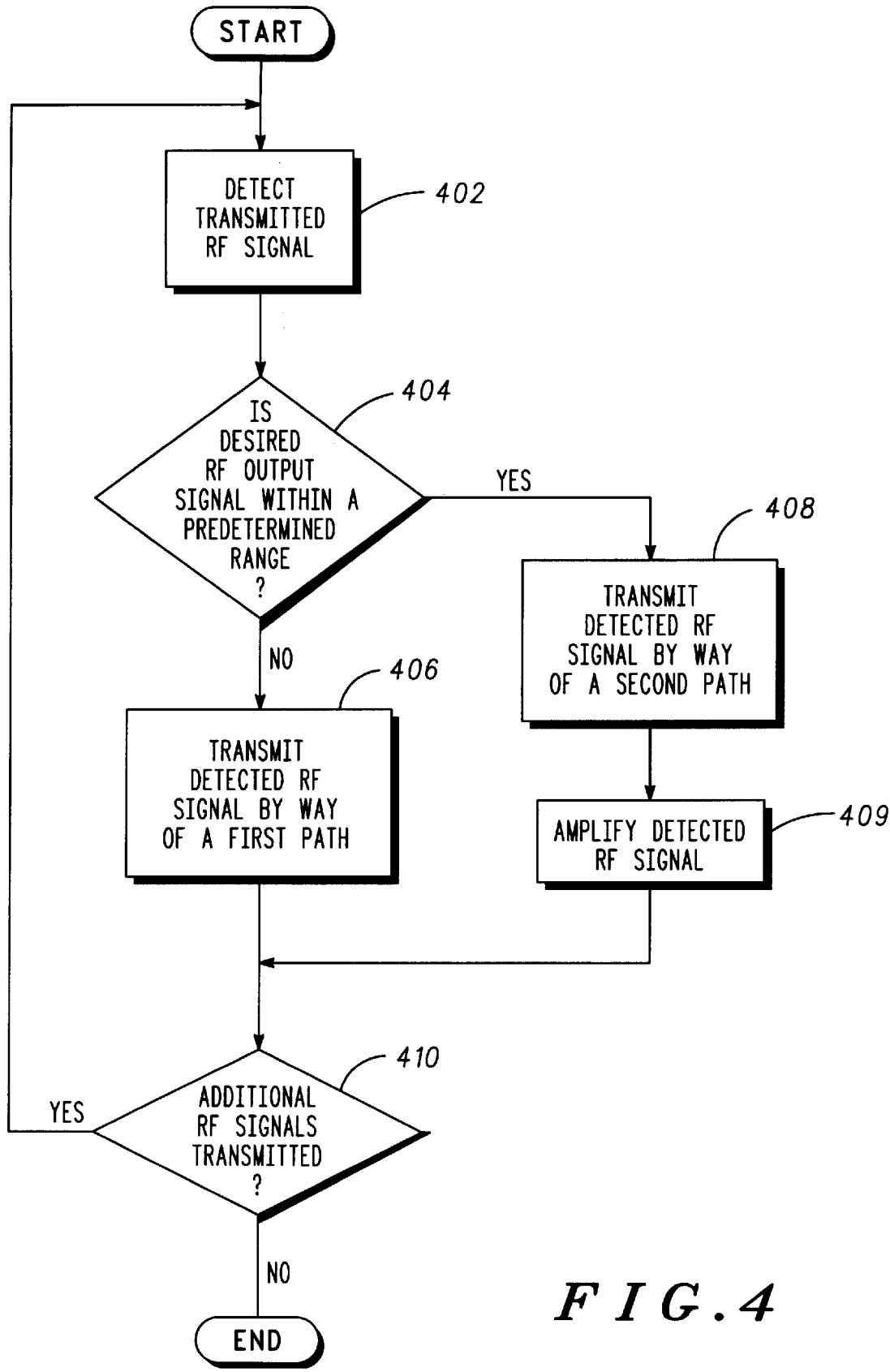
FIG. 4 is a flow chart showing a method of detecting signals according to the present invention.

Turning now to FIG. 4, the preferred steps for selecting a RF path according to the present invention are shown. At a step 402, an RF signal is detected by coupler 304, enabling detecting circuitry 215 to generate a RF DET signal. CONTROL signal 332 will determine through which path the RF signal will be detected. Preferably, CONTROL signal 332 will be generated by microprocessor 103 and coupled to transmitter 123 by way of bus 124 and will depend upon the power level of the RF signal being transmitted. Alternatively, CONTROL signal 332 could depend upon the previously detected RF signal. Detecting circuitry 215 will detect an RF signal by way of a first path at a step 406 if the RF signal is not within a predetermined range. For example, the RF signal could be detected by the first path if the transmitted RF signal is not below a pre-determined level at step 404. Detecting circuitry 215 will detect an RF signal by way of second path at a step 408 if the transmitted RF signal is within a predetermined range. The detected RF signal will then be amplied by an amplifier in the second path, such as amplifier 372. The device will then determine whether additional RF signals are transmitted at a step 410 and continue to detect RF signals at a step 402 if necessary.

Figure 5:
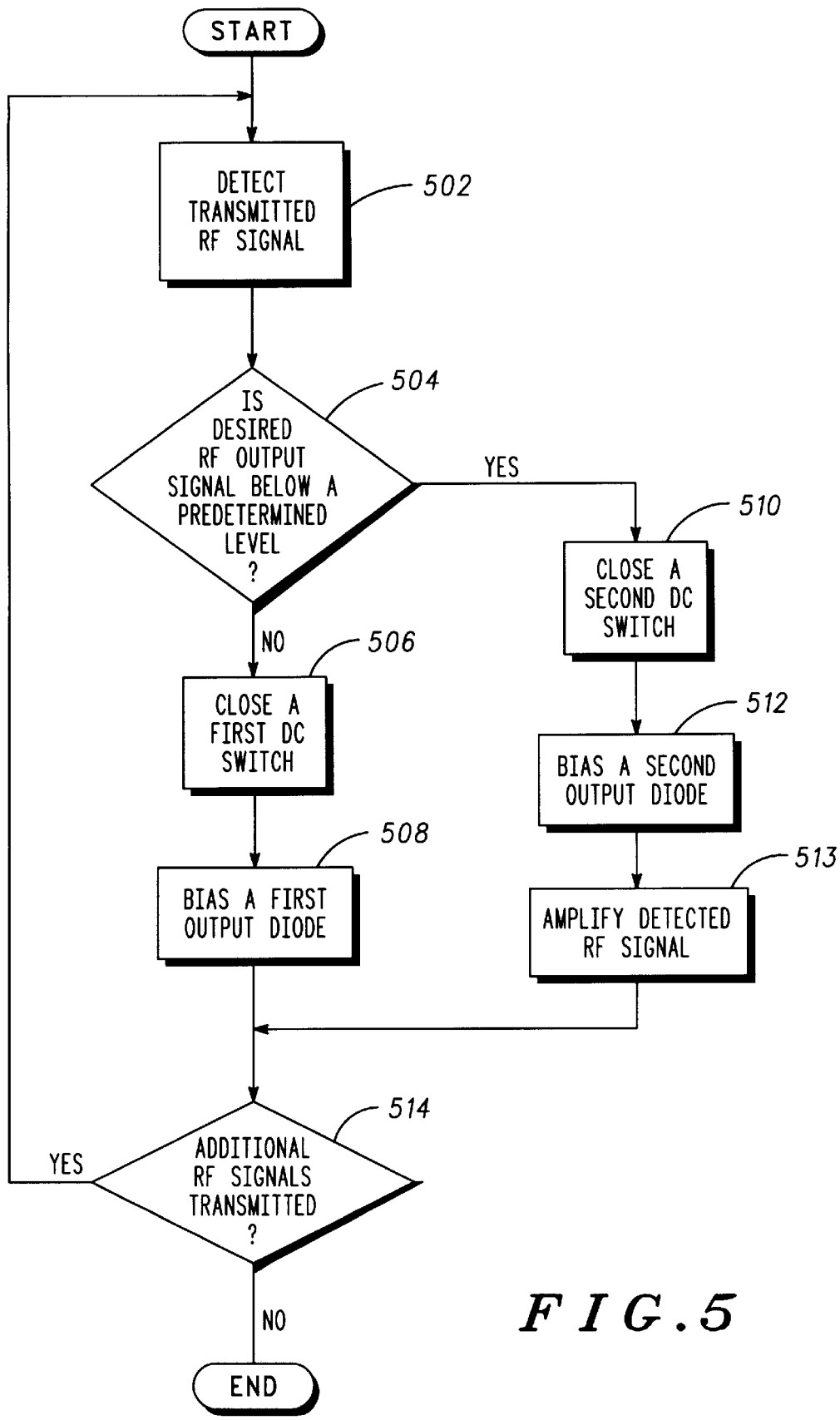
FIG. 5 is a flow chart showing an alternate embodiment of a method for detecting signals according to the present invention.

Turning now to FIG. 5, the preferred steps for an alternate embodiment for selecting an RF path are shown. Coupler 304 detects transmitter RF signals at a step 502. If the transmitted RF signal is not below a pre-determined level at a step 504, a first DC switch is closed at a step 506 and a first output diode is biased at a step 508 to detect the RF signal by way of the first path. The first DC switch could be, for example, transitor 340 to bias output diode 316. If the transmitted RF signal is below a pre-determined level at a step 504, a second DC switch will be closed at step 510 and a second output diode will be biased at a step 512 to detect the RF signal by way of the second RF path. The second DC switch could be, for example, transitor 358, while the second output diode could be diode 318. The detected signal is then amplified at a step 513 by an amplifier such as transistor 372. The microprocessor determines whether additional RF signals are transmitted at step 514, and continues to detect the transmitted RF signals at step 502 if necessary.

According to the present disclosure, a unique method and apparatus for detecting communication signals, such as RF communication signals being transmitted from a wireless communication device, increases the dynamic range of a conventional power detector. As set forth in more detail below, the method and apparatus selectively switches between two power detection paths with different operating ranges. More particularly, when a transmitted signal having a power within a predetermined range is detected, a first diode associated with a first path is biased to transmit the RF communication signal. The predetermined range could be determined, for example, by a number of power steps. Similarly, when a transmitted signal having a power in a second predetermined range is detected, such as a low power transmitted signal, a second path provided. Preferably, the second path includes an amplifier to offset the loss of resolution as the detect voltage is low.

Although the invention has been described and illustrated in the above description and drawings, it is understood that this description is by way of example only and that numerous changes and modifications can be made by those skilled in the art without departing from the true spirit and scope of the invention. For example, although two paths are shown, three or more paths could be employed within the scope of he present invention. Although the present invention finds particular application in portable cellular radiotelephones, the invention could be applied to any wireless communication device, including pagers, electronic organizers, or computers. Applicant's invention should be limited only by the following claims.

I claim:

1. A power detector comprising:
   a first RF path coupled to receive a detected RF signal and having a first diode coupled to an output;
   a second RF path coupled to receive said detected RF signal and having a second diode coupled to said output, said second RF path having an amplifier device for amplifying said detected RF signal; and
   a control circuit coupled to said first RF path and said second RF path for selectively coupling said detected RF signal to said output by way of said first RF path or said second RF path, wherein said control circuit comprises a first switch coupled to bias said first diode when said detected RF signal is above a predetermined level and wherein said control circuit further comprises a second switch coupled to bias said second diode when said detected RF signal is below said predetermined level.

2. The power detector of claim 1 wherein said first switch and said second switch comprise field effect transistors.

3. The power detector of claim 1 wherein said amplifier device comprises a transistor amplifier.

4. The power detector of claim 1 further comprising a control signal coupled to said first switch, said control signal turning on said first switch to bias said first diode when said control signal is in a first state.

5. The power detector of claim 4 wherein said control circuit comprises a control switch for receiving said control signal, said control switch turning on said second switch when said control signal is in a second state.

6. A power detector comprising:
   a coupler for detecting an RF signal;
   a first RF path coupled to said coupler to receive a detected RF signal, said first RF path having a first diode coupled to an output;
   a second RF path coupled to said coupler to receive said detected RF signal, said second RF path further comprising a second diode coupled to said output and having an amplifier device for amplifying said detected RF signal; and
   a control circuit having a first transistor coupled to bias said first diode when said detected RF signal is above a predetermined level and a second transistor coupled to bias said second diode when said detected RF signal is below said predetermined level.

7. A power detector comprising:
   a coupler for detecting an RF signal;

a first RF path coupled to said coupler to receive a detected RF signal, said first RF path having a first diode coupled to an output;

a second RF path coupled to said coupler to receive said detected RF signal, said second RF path further comprising a second diode coupled to said output and having an amplifier device for amplifying said detected RF signal;

a first transistor coupled to bias said first diode;

a second transistor coupled to bias said second diode;

a control signal coupled to said first transistor, said control signal turning on said first transistor to bias said first diode when said control signal is in a first state; and a control circuit having a control switch for receiving said control signal, said control switch turning on said second transistor when said control signal is in a second state.

8. A method for detecting RF power in a circuit, said method comprising the steps of:

coupling RF signals from a first coupling element;

transmitting an RF signal coupled from said first coupling element by way of a first path when said RF signal is above a predetermined level:

biasing a first output diode in said first path by closing a first switch when said RF signal is above said predetermined level;

detecting an RF signal outside said first predetermined range;

biasing a second output diode in said second path by closing a second DC switch when said RF signal is below said predetermined level:

amplifying the detected RF signal coupled from said first coupling element; and transmitting the detected RF signals by way of a second path.

9. A method for detecting RF power in a circuit, said method comprising the steps of:

transmitting an RF signal by way of a first path when said RF signal is above a predetermined level;

biasing a first output diode in said first path by closing a first switch when said RF signal is above said predetermined level;

detecting an RF signal below said predetermined level;

biasing a second output diode in said second path by closing a second switch when said RF signal is below said predetermined level;

amplifying the detected RF signal; and transmitting the detected RF signals by way of a second path.

10. A power detector comprising:

a coupling element for coupling detected RF signals;

a first RF path coupled to receive said detected RF signal from said coupling element and coupled to an output, wherein said first RF path comprises a first diode coupled to said output;

a second RF path coupled to receive said detected RF signal from said coupling element and coupled to said output, said second RF path further comprises a second diode coupled to said output and having an amplifier device for amplifying said detected RF signal; and a control circuit coupled to said first RF path and said second RF path for selectively coupling said detected RF signal to said output by way of said first RF path or said second RF path, wherein said control circuit comprises a first switch coupled to bias said first diode when said detected RF signal is above a predetermined level and wherein said control circuit switch comprises a second switch coupled to bias said second diode when said detected RF signal is below said predetermined level.

11. The power detector of claim 10 wherein said first switch and said second switch comprise field effect transistors.

12. The power detector of claim 10 wherein said amplifier device comprises a transistor amplifier.

13. The power detector of claim 10 further comprising a control signal coupled to said first switch, said control signal turning on said first switch to bias said first diode when said control signal is in a first state.

14. The power detector of claim 13 wherein said control circuit comprises a control switch for receiving said control signal, said control switch turning on said second switch when said control signal is in a second state.

* * * * *